US010810505B2

(12) United States Patent
Sandberg et al.

(10) Patent No.: US 10,810,505 B2
(45) Date of Patent: Oct. 20, 2020

(54) REMOVAL OF WIREBONDS IN QUANTUM HARDWARE

(71) Applicant: International Business Machines Corporation, Armonk, NY (US)

(72) Inventors: Martin O. Sandberg, Ossining, NY (US); Vivekananda P. Adiga, Ossining, NY (US); Robert Connelly, New Milford, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/738,424

(22) Filed: Jan. 9, 2020

(65) Prior Publication Data

US 2020/0210878 A1      Jul. 2, 2020

Related U.S. Application Data

(62) Division of application No. 16/238,091, filed on Jan. 2, 2019.

(51) Int. Cl.
*H01L 23/00* (2006.01)
*G06N 10/00* (2019.01)

(52) U.S. Cl.
CPC ............. *G06N 10/00* (2019.01); *H01L 24/49* (2013.01); *H01L 24/85* (2013.01)

(58) Field of Classification Search
CPC ....................................................... H01L 24/85
See application file for complete search history.

(56) References Cited

U.S. PATENT DOCUMENTS

2017/0110437 A1 *   4/2017   Garing ................ H01L 21/4835

OTHER PUBLICATIONS

List of all IBM related dockets, Appendix P, 2019.

* cited by examiner

*Primary Examiner* — Peniel M Gumedzoe
*Assistant Examiner* — Christopher A Johnson
(74) *Attorney, Agent, or Firm* — Garg Law Firm, PLLC; Rakesh Garg; Keivan Razavi

(57) ABSTRACT

A product causes a method to be performed, the method includes depositing a first layer on a portion of a first surface of a quantum hardware, the portion of the first surface comprising a set of wirebonds. The method further includes coupling the set of wirebonds to the first layer. The method further includes removing the first layer and the set of wirebonds from the first surface of the quantum hardware. In an embodiment, the first layer is an inert polymer in solution.

20 Claims, 8 Drawing Sheets

REMOVAL OF WIREBONDS IN QUANTUM HARDWARE

TECHNICAL FIELD

The present invention relates generally to a method for fabrication of quantum hardware. More particularly, the present invention relates to a method for removal of wirebonds in quantum hardware.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two thin-film superconducting metal layers by a non-superconducting material. When the conductor in the superconducting layers is caused to become superconducting—e.g. by reducing the temperature of the conductor to a specified cryogenic temperature—pairs of electrons can tunnel from one superconducting layer through the non-superconducting layer to the other superconducting layer. In certain qubit designs, referred to as a transmon qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is a classical output that represents the projection of the qubit state.

A superconducting qubit has two quantum states—|0> and |1>. These two states may be two energy states of atoms, for example, the ground (|g>) and first excited state (|e>) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

For quantum computing using qubits to be reliable, quantum hardwares, e.g., the qubits themselves, the readout circuitry associated with the qubits, and other parts of the quantum processor, must not alter the energy states of the qubit, such as by injecting or dissipating energy, in any significant manner or influence the relative phase between the |0> and |1> states of the qubit. This operational constraint on any circuit that operates with quantum information necessitates special considerations in fabricating semiconductor and superconducting structures that are used in such circuits.

The connection lines or wirebonds on a quantum device, route signals around the quantum device, between the quantum device and the external circuit, and vice versa. Oftentimes, wirebonds may need to be removed from the quantum device. Some non-limiting reasons for removing the wirebonds include (1) broken or incomplete wirebonds, (2) incorrect wirebond pattern, (3) residue around wirebonds from fabrication, (4) removal of all wirebonds for post-processing. The presently available methods for removing wirebonds include manually removing wirebonds one at a time using tweezers.

The illustrative embodiments recognize certain disadvantages with the presently available methods for removing wirebonds on quantum hardwares. Manually removing wirebonds is (1) time-consuming and inefficient, (2) risks damaging the quantum device through contact with the removal tool, and (3) risk debris and residue remaining on the quantum device.

SUMMARY

The illustrative embodiments provide a method for removal of wirebonds on quantum hardwares. A method of an embodiment includes depositing a first layer on a portion of a first surface of a quantum hardware, the portion of the first surface comprising a set of wirebonds. In an embodiment, the method includes bonding the set of wirebonds mechanically to the first layer. In an embodiment, the method includes removing the first layer and the set of wirebonds from the first surface of the quantum hardware.

In an embodiment, the first layer comprises an inert polymer in solution. In an embodiment, the portion covers the entirety of the first surface. In an embodiment, the method includes securing, prior to depositing the first layer, the quantum hardware in place on a vacuum device.

In an embodiment, the method includes sealing a second surface of the quantum hardware, the second surface being opposite the first surface. In an embodiment, the method includes depositing a second layer on a portion of the second surface of the quantum hardware.

In an embodiment, the second layer is a thin film configured to seal the second surface from the first layer. In an embodiment, the method includes curing the first layer to mechanically bond the set of wirebonds to the first layer. In an embodiment, the first layer is cured at room temperature.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
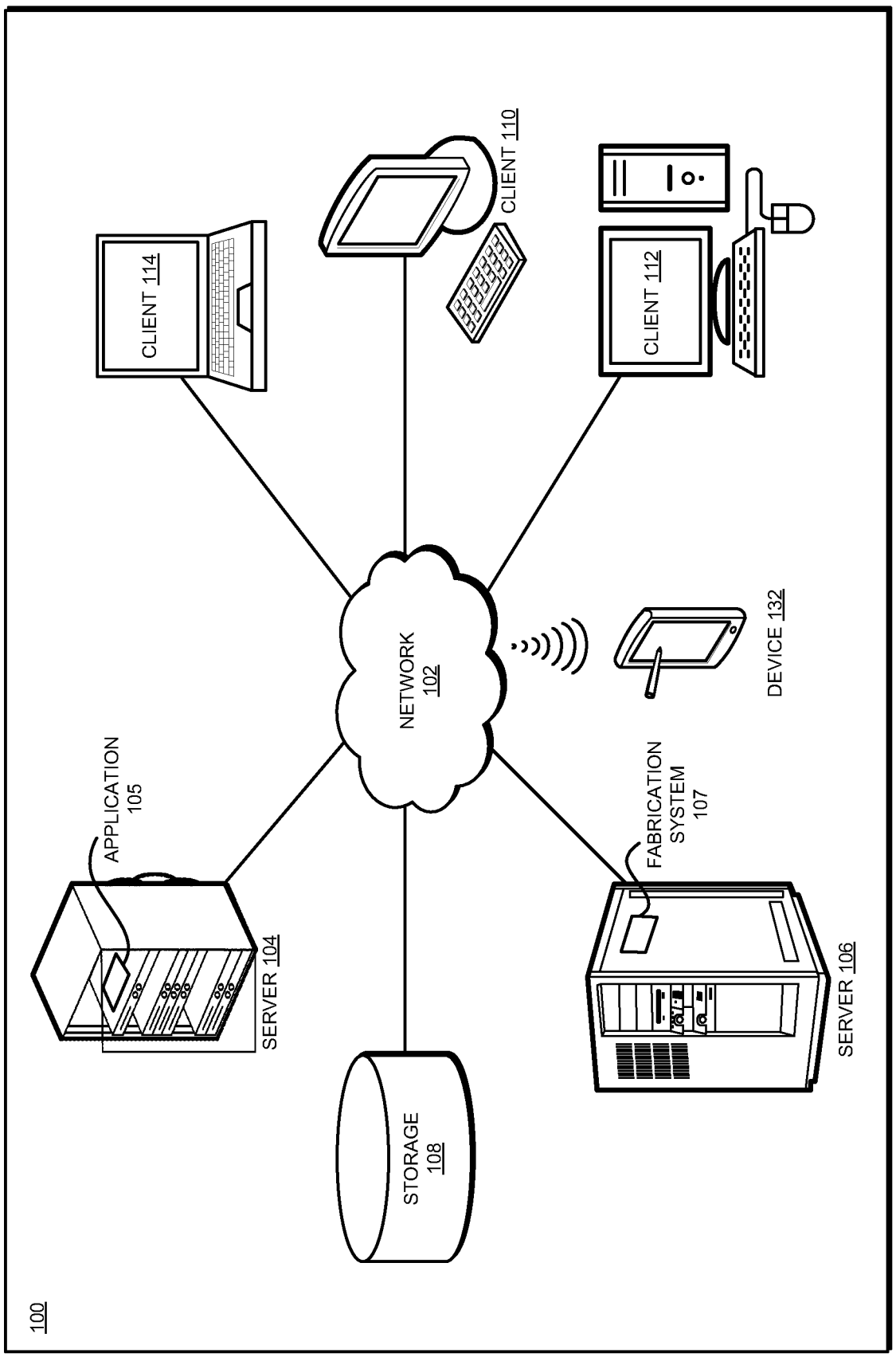
FIG. 1 depicts a block diagram of a network of data processing systems in which illustrative embodiments may be implemented.

The illustrative embodiments used to describe the invention generally address and solve the above-described needs for removal of wirebonds on quantum hardwares. The illustrative embodiments provide a method for removal of wirebonds on quantum hardwares, which address the above-described need or problem.

An operation described herein as occurring with respect to a frequency of frequencies should be interpreted as occurring with respect to a signal of that frequency or frequencies. All references to a "signal" are references to a microwave signal unless expressly distinguished where used.

An embodiment provides a method for removal of wirebonds on quantum hardwares, such that the method can be implemented as a software application. The application implementing a method embodiment can be configured to operate in conjunction with an existing semiconductor fabrication system—such as a packaging system, or a circuit assembly system.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the example wirebonds, polymers, qubits, resonators, and other circuit components are used in the figures and the illustrative embodiments. In an actual fabrication or circuit, additional structures or component that are not shown or described herein, or structures or components different from those shown but for a similar function as described herein may be present without departing the scope of the illustrative embodiments.

Furthermore, the illustrative embodiments are described with respect to specific actual or hypothetical components only as examples. The steps described by the various illustrative embodiments can be adapted for removal of wirebonds using a variety of components that can be purposed or repurposed to provide a described function within a quantum device, and such adaptations are contemplated within the scope of the illustrative embodiments.

The illustrative embodiments are described with respect to certain types of materials, electrical properties, steps, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to the figures and in particular with reference to FIG. 1, this figure is an example diagram of data processing environments in which illustrative embodiments may be implemented. FIG. 1 is only an example and is not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Device 132 is an example of a mobile computing device. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Figure 2:
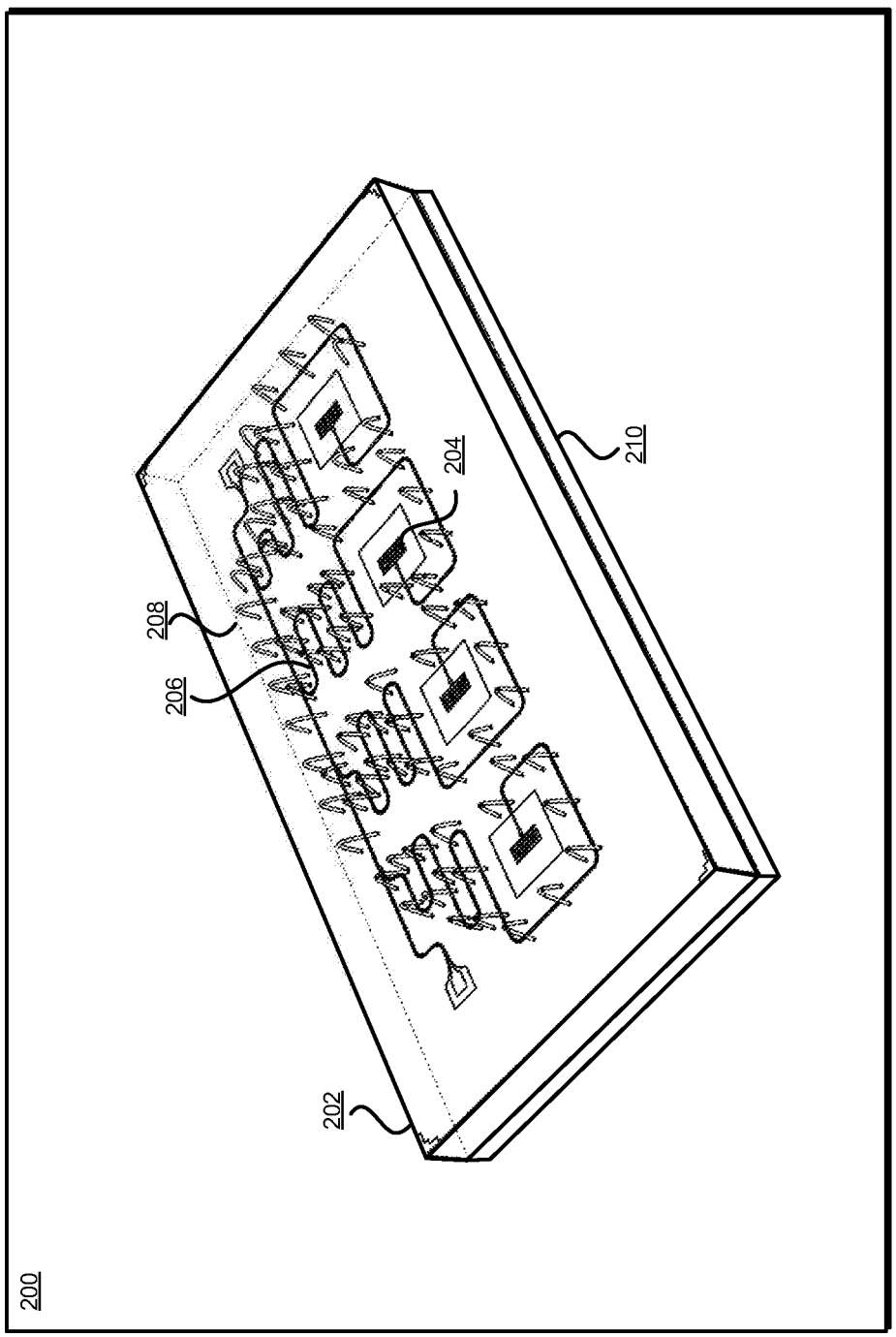
FIG. 2 depicts a configuration of a quantum hardware device in accordance with an illustrative embodiment.

Application 105 implements an embodiment described herein. Fabrication system 107 is any suitable system for fabricating a semiconducting or superconducting device. Application 105 provides instructions to system 107 for a fabrication process in a manner described herein With reference to FIG. 2, this figure depicts a configuration of a quantum hardware device in accordance with an illustrative embodiment. Configuration 200 includes quantum hardware device 202 and first layer 210. Quantum hardware device 202 includes a qubit 204, a resonator 206, and a set of wirebonds, such as wirebond 208. In an embodiment, quantum hardware device 202 includes a plurality of qubits and a plurality of resonators. An embodiment forms qubit 204, resonator 206, and the set of wirebonds on a first surface of the quantum hardware device 202. An embodiment forms first layer 210 on a second surface of the quantum hardware 202. In an embodiment, the second surface is opposite of the first surface. First layer 210 is configured to mechanically bond to the second surface of the quantum hardware device 202. In an embodiment, first layer 210 comprises a material with high peel strength (above a threshold). In an embodiment, first layer 210 is formed using a material that exhibits a peel strength of at least 1 kN/m, threshold level of peel strength. Peel strength is measured as the average load per unit width required to separate mechanically bonded materials where the angle of separation is 180 degrees. In an embodiment, first layer 210 comprises a material with high peel adhesion (above a threshold) in a cryogenic temperature range.

In an embodiment, first layer 210 comprises a material with high elongation (above a threshold). In an embodiment, first layer 210 is formed using a material that exhibits an elongation of at least 140%, threshold level of elongation. Elongation is a measure of the percentage of strain before failure of a material. In an embodiment, first layer 210 comprises a material with high elastic modulus (above a threshold). In an embodiment, first layer 210 is formed using a material that exhibits an elastic modulus of at least 1 MPa, threshold level of elastic modulus. Elastic modulus is a measure of a material's resistance to deformation due to an applied stress. In an embodiment, first layer 210 comprises a material with high tensile strength (above a threshold). In an embodiment, first layer 210 is formed using a material that exhibits a tensile strength of at least 7.1 MPa, threshold level of tensile strength. Tensile strength is the maximum amount of stress applied to a material before failure.

Figure 3:
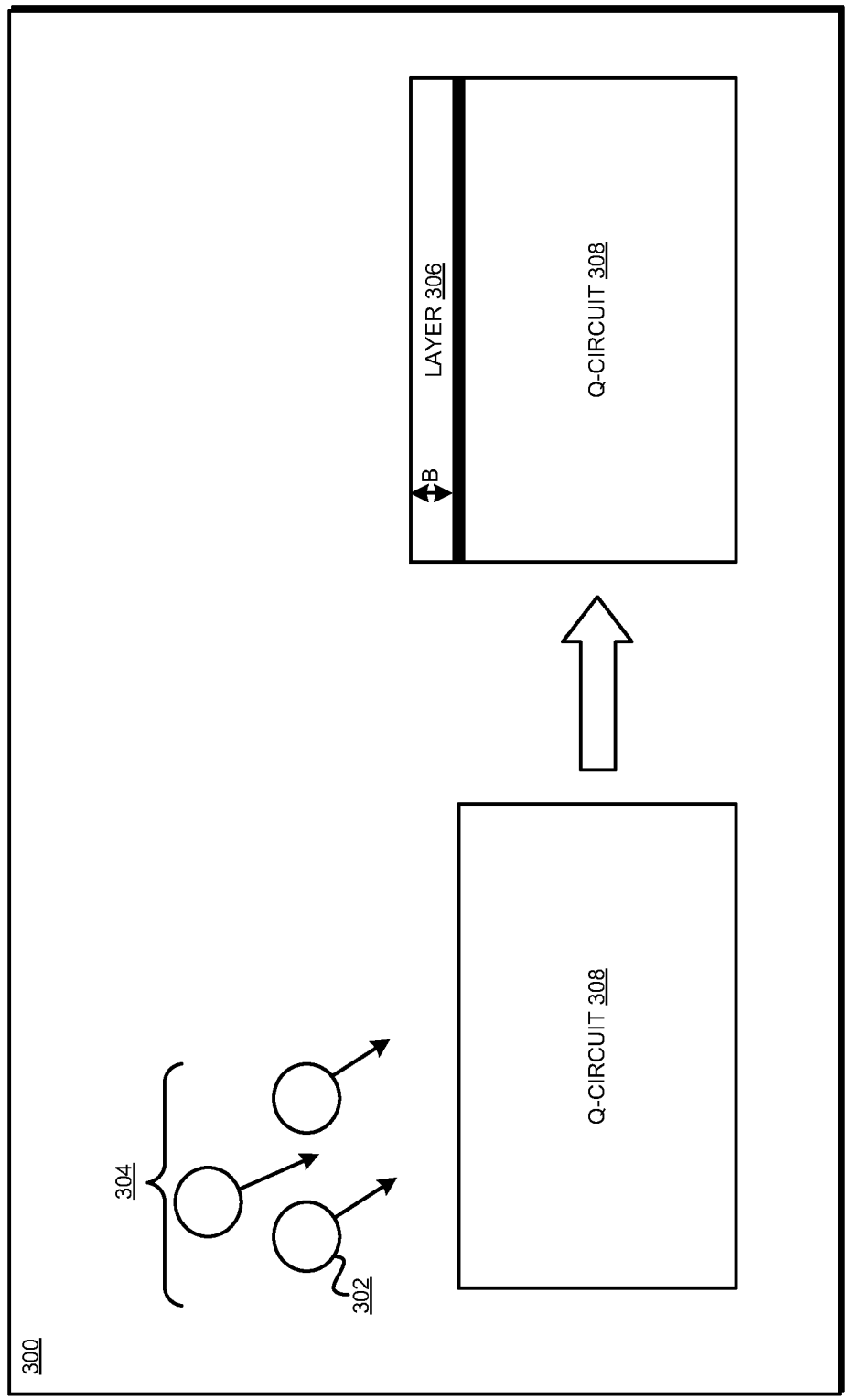
FIG. 3 depicts a block diagram of an example quantum hardware configuration in accordance with an illustrative embodiment.

With reference to FIG. 3, this figure depicts a block diagram of an example quantum hardware configuration in accordance with an illustrative embodiment. Application 105 in FIG. 1 interacts with fabrication system 107 to produce or manipulate configuration 300 as described herein.

Configuration 300 depicts quantum hardware 308. An embodiment causes the fabrication system to deposit material 304, thus forming first layer 306. First layer 306 is an example of first layer 210 in FIG. 2. In an embodiment, first layer 306 seals a second surface of the quantum hardware device 308. In an embodiment, first layer 306 is deposited on the second surface of the quantum hardware 308. For example, first layer 306 can be a deposition of particles 302 on quantum hardware device 308. This example of a deposition method is not intended to be limiting. From this disclosure, those of ordinary skill in the art will be able to conceive of many other methods and processes suitable for forming the first layer and the same are contemplated within the scope of the illustrative embodiments.

Figure 4:
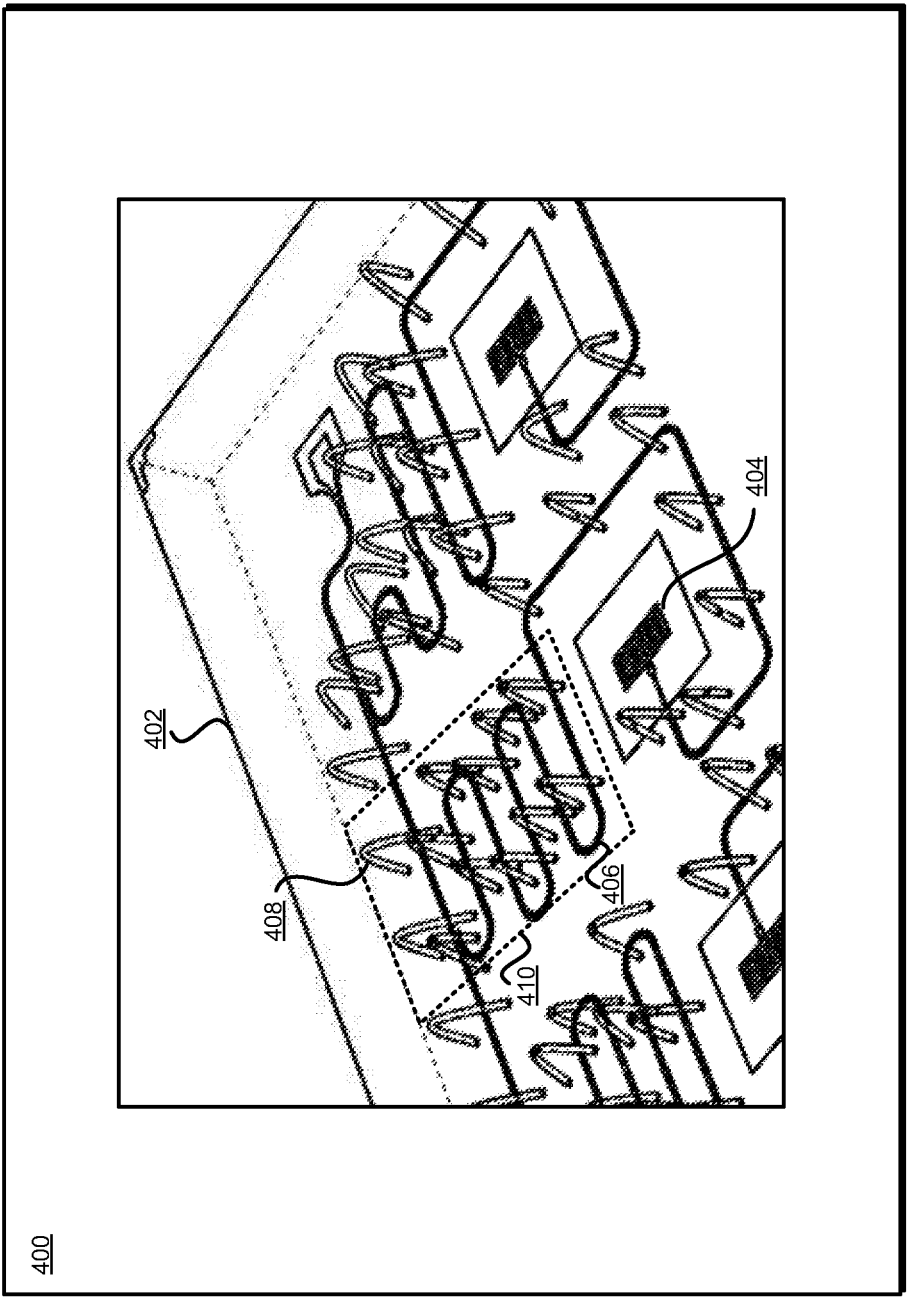
FIG. 4 depicts an example quantum hardware device configuration in accordance with an illustrative embodiment.

With reference to FIG. 4, this figure depicts an example quantum hardware device configuration in accordance with an illustrative embodiment. Application 105 in FIG. 1 interacts with fabrication system 107 to produce or manipulate configuration 400 as described herein.

Configuration 400 depicts quantum hardware 402. Quantum device 402 is an example of quantum device 308 in FIG. 3. Quantum hardware 402 comprises qubit 404, resonator 406, and plurality of wirebonds, such as wirebond 408. An embodiment causes a fabrication system, such as fabrication system 107 in FIG. 1, to select a portion 410 of the quantum device surface for removal of a subset of the set of wirebonds.

An embodiment causes a fabrication system, such as fabrication system 107 in FIG. 1, to select the portion 410 based on at least one selection criterion. For example, a fabrication system can select the portion 410 due to incomplete wirebonds in the subset of the set of wirebonds, broken wirebonds in the subset of the set of wirebonds, an incorrect wirebond pattern in the portion 410, material residue in portion 410, removal of all wirebonds in portion 410 for post-processing steps, and other selection criterion for removal of wirebonds. These examples of selection criterion are not intended to be limiting. From this disclosure, those of ordinary skill in the art will be able to conceive of many other selection criterion suitable for selecting a portion of a quantum device for removal of wirebonds and the same are contemplated within the scope of the illustrative embodiments.

Figure 5:
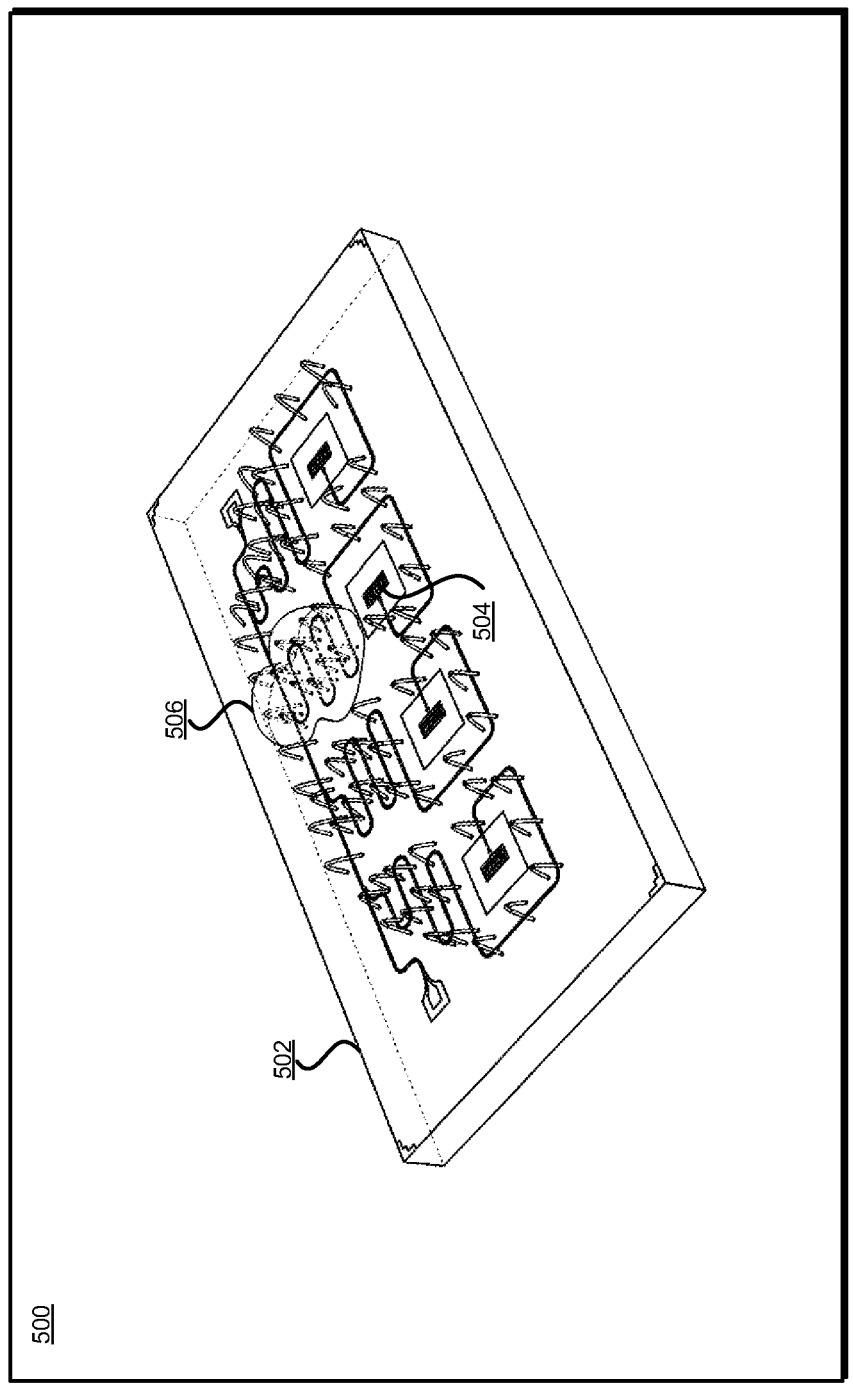
FIG. 5 depicts an example quantum hardware configuration in accordance with an illustrative embodiment.

With reference to FIG. 5, this figure depicts an example quantum hardware configuration in accordance with an illustrative embodiment. Application 105 in FIG. 1 interacts with fabrication system 107 to produce or manipulate configuration 500 as described herein. Configuration 500 is an example of configuration 400 in FIG. 4.

Configuration 500 comprises quantum hardware 502, qubit 504, and material 506. An embodiment causes a fabrication system, such as fabrication system 107 in FIG. 1, to deposit material 506 on a portion of the quantum hardware 502 surface. In an embodiment, the portion of the quantum device 502 is an example of the portion 410 in FIG. 4. In an embodiment, material 506 is an inert polymer in solution. An embodiment configures material 506 to mechanically bond to a subset of the set of wirebonds. In an embodiment, fabrication system 107 deposits material 506 by pipette. In an embodiment, fabrication system 107 deposits material 506 by brushing onto the portion of the quantum device 502. These examples deposition methods are not intended to be limiting. From this disclosure, those of ordinary skill in the art will be able to conceive of many other deposition methods suitable for depositing material on a portion of a quantum device and the same are contemplated within the scope of the illustrative embodiments.

Figure 6:
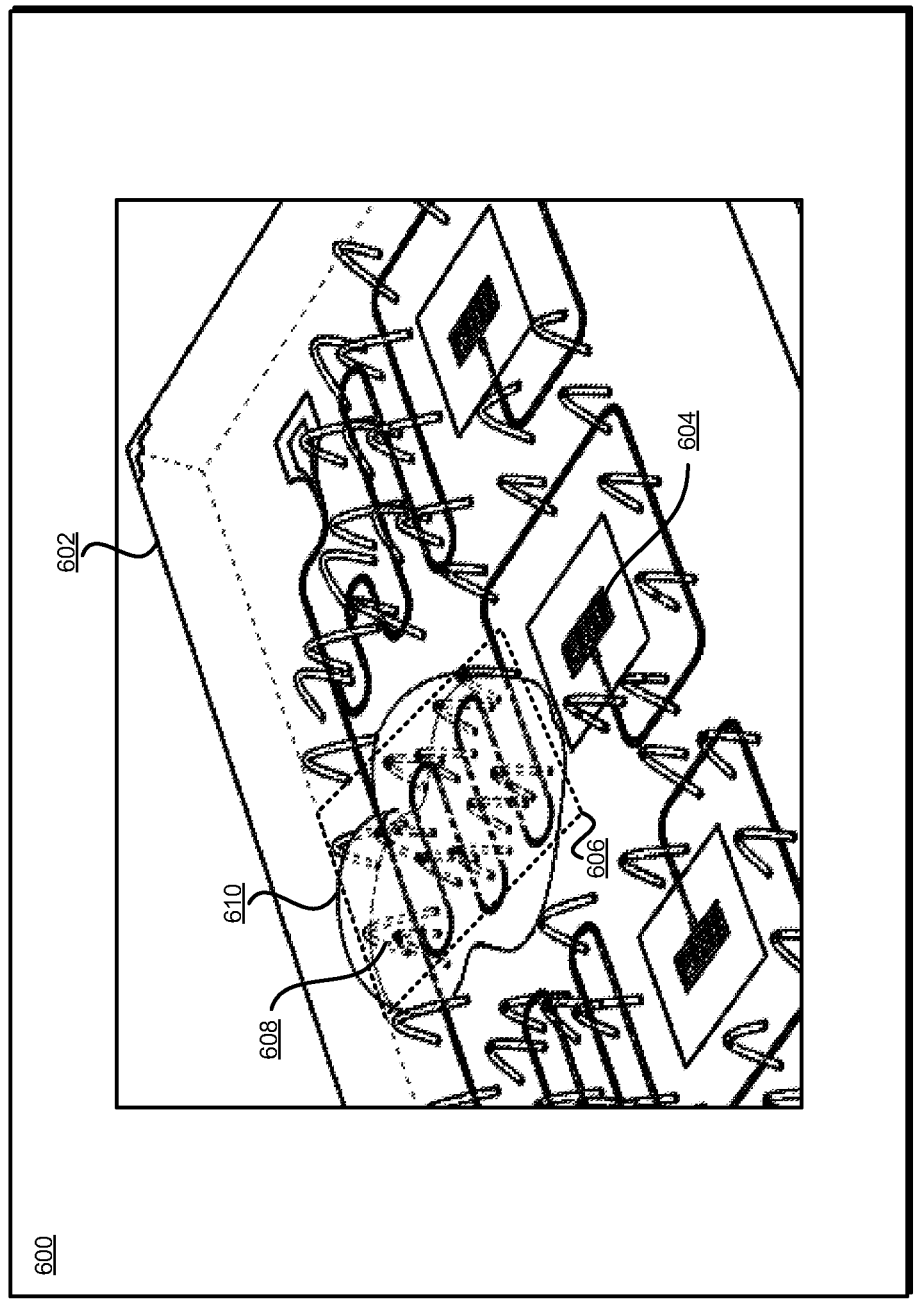
FIG. 6 depicts an example quantum hardware configuration in accordance with an illustrative embodiment.

With reference to FIG. 6, this figure depicts an example quantum hardware configuration in accordance with an illustrative embodiment. Application 105 in FIG. 1 interacts with fabrication system 107 to produce or manipulate configuration 600 as described herein.

Configuration 600 comprises quantum hardware 602, qubit 604, a set of wirebonds, such as wirebond 608, and a material 610. An embodiment causes a fabrication system, such as fabrication system 107 in FIG. 1, to deposit material 610 on a portion 606 of the surface of the quantum hardware 602. Portion 606 is an example of selected portion 410 in FIG. 4.

An embodiment causes a fabrication system, such as fabrication system 107 in FIG. 1, to couple (mechanically bond) the wirebonds in the portion 606 to the material 610. In an embodiment, the fabrication system cures the material 610. For example, fabrication system can heat the material 610 to form a solid film. As another example, fabrication system can set a timer to allow the material 610 to cure at room temperature. An embodiment configures the material 610 to mechanically bond to a subset of the set of wirebonds disposed in the portion 606. In an embodiment, material 610 forms a strong, flexible film after curing. In an embodiment, material 610 forms a plastic film after curing.

An embodiment causes a fabrication system, such as fabrication system 107 in FIG. 1, to remove the material 610, removing the subset of the set of wirebonds coupled (mechanically bonded) to the material 610. In an embodiment, the material 610 is lifted off of the surface of the quantum hardware 602.

Figure 7:
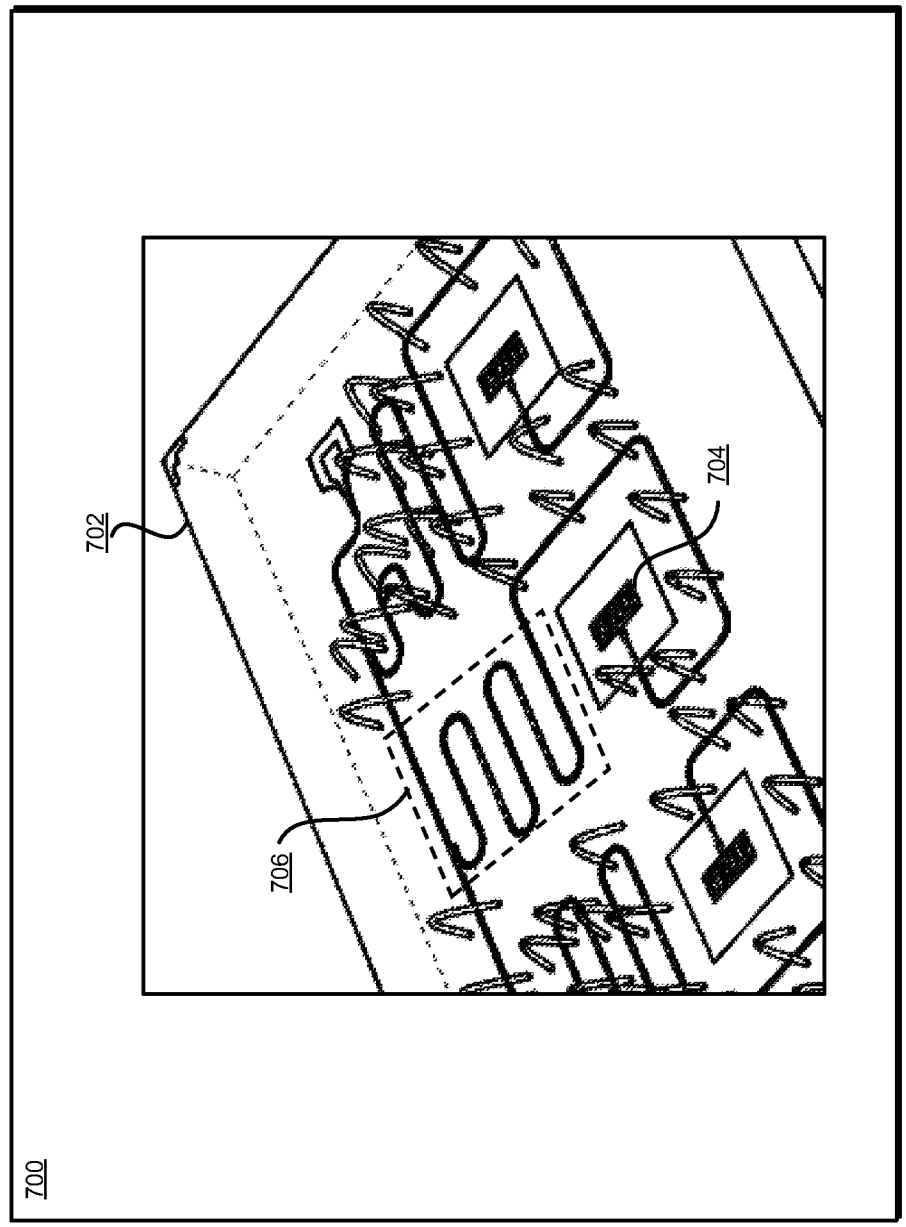
FIG. 7 depicts an example quantum hardware configuration in accordance with an illustrative embodiment.

With reference to FIG. 7, this figure depicts an example quantum hardware configuration in accordance with an illustrative embodiment. Application 105 in FIG. 1 interacts with fabrication system 107 to produce or manipulate configuration 700 as described herein.

Configuration 700 comprises quantum hardware 702. Quantum hardware 702 includes qubit 704 and a portion 706 of a first surface. An embodiment causes a fabrication system, such as fabrication system 107 in FIG. 1, to remove material, such as material 610 in FIG. 6, from the portion 706. An embodiment causes a fabrication system, such as fabrication system 107 in FIG. 1, to remove the subset of the set of wirebonds previously disposed in portion 706 and mechanically bonded to the material 610 from the portion 706.

Figure 8:
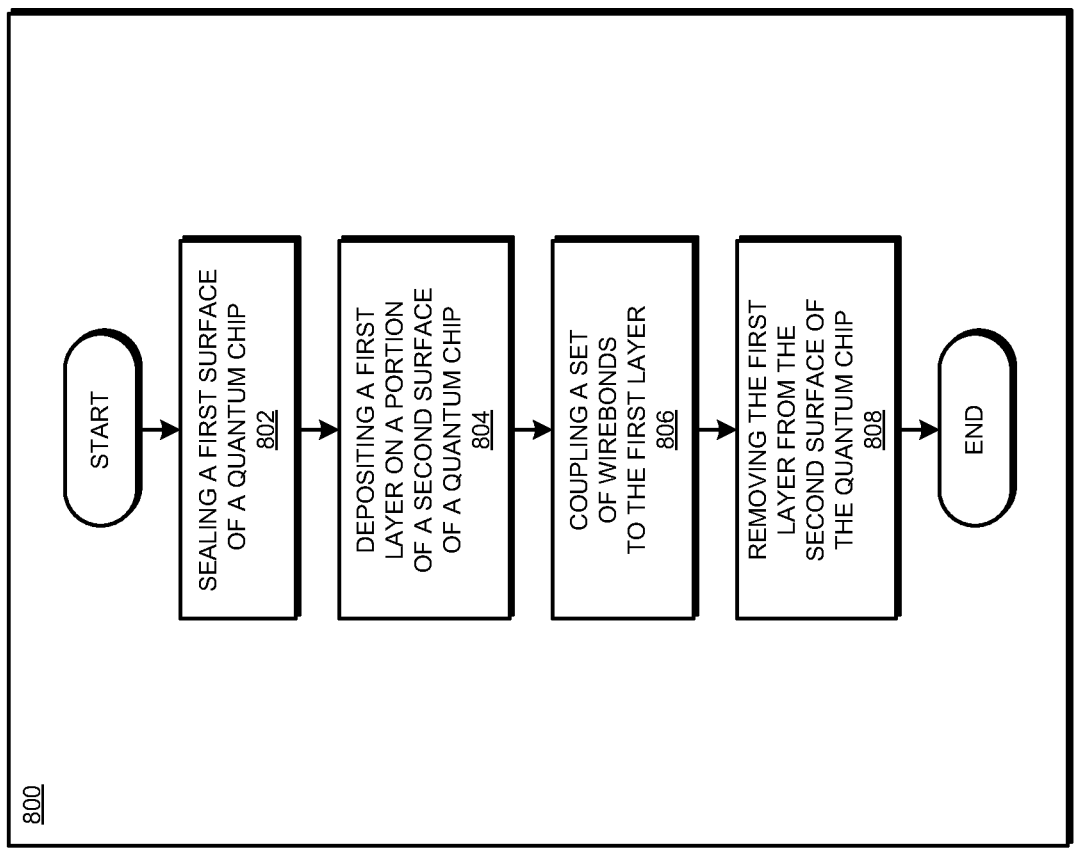
FIG. 8 depicts a flowchart of a process for removal of wirebonds in quantum hardwares in accordance with an illustrative embodiment.

With reference to FIG. 8, this figure depicts a flowchart of a process for removal of wirebonds in quantum hardwares in accordance with an illustrative embodiment. Process 800 can be implemented in application 105 in FIG. 1, to deposit a set of layers, to secure a quantum hardware, to cure a set of layers, and to remove layers and a subset of a set of wirebonds, as described with respect to FIGS. 2-7.

The application causes a fabrication system to seal a first surface of a quantum hardware (block 802). The application causes a fabrication system to deposit a first layer on a portion of a second surface of a quantum hardware (block 804). The application causes a fabrication system to couple (mechanically bond) a set of wirebonds to the first layer (block 806). The application causes a fabrication system to remove the first layer from the second surface of the quantum hardware (block 808). The application ends process 800 thereafter.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer usable program product comprising a computer-readable storage device, and program instructions stored on the storage device, the stored program instructions comprising:
    program instructions to deposit a first layer on a portion of a first surface of a quantum hardware, the portion of the first surface comprising a set of wirebonds;
    program instruction to bond the set of wirebonds mechanically to the first layer; and
    program instructions to remove the first layer and the set of wirebonds from the first surface of the quantum hardware.

2. The computer usable program product of claim 1, wherein the stored program instructions are stored in a computer readable storage device in a data processing system, and wherein the stored program instructions are transferred over a network from a remote data processing system.

3. The computer usable program product of claim 1, wherein the stored program instructions are stored in a computer readable storage device in a server data processing system, and wherein the stored program instructions are downloaded over a network to a remote data processing system for use in a computer readable storage device associated with the remote data processing system.

4. The computer usable program product of claim 1, wherein the first layer comprises an inert polymer in solution.

5. The computer usable program product of claim 1, wherein the portion covers the entirety of the first surface.

6. The computer usable program product of claim 1, the stored program instructions further comprising:
    program instructions to secure, prior to depositing the first layer, the quantum hardware in place on a vacuum device.

7. The computer usable program product of claim 1, the stored program instructions further comprising:
    program instructions to seal a second surface of the quantum hardware, the second surface being opposite the first surface.

8. The computer usable program product of claim 7, the program instructions to seal the second surface further comprising:
    program instructions to deposit a second layer on a portion of the second surface of the quantum hardware.

9. The computer usable program product of claim 8, wherein the second layer is a thin film configured to seal the second surface from the first layer.

10. The computer usable program product of claim 1, the program instructions to bond the set of wirebonds further comprising:
    program instructions to cure the first layer to mechanically bond the set of wirebonds to the first layer.

11. The computer usable program product of claim 10, wherein the first layer is cured at room temperature.

12. A computer system comprising a processor, a computer-readable memory, and a computer-readable storage device, and program instructions stored on the storage device for execution by the processor via the memory, the stored program instructions comprising:
    program instructions to deposit a first layer on a portion of a first surface of a quantum hardware, the portion of the first surface comprising a set of wirebonds;
    program instruction to bond the set of wirebonds mechanically to the first layer; and
    program instructions to remove the first layer and the set of wirebonds from the first surface of the quantum hardware.

13. The computer system of claim 12, wherein the first layer comprises an inert polymer in solution.

14. The computer system of claim 12, wherein the portion covers the entirety of the first surface.

15. The computer system of claim 12, the stored program instructions further comprising:
    program instructions to secure, prior to depositing the first layer, the quantum hardware in place on a vacuum device.

16. The computer system of claim 12, the stored program instructions further comprising:
    program instructions to seal a second surface of the quantum hardware, the second surface being opposite the first surface.

17. The computer system of claim 16, the program instructions to seal the second surface further comprising:
    program instructions to deposit a second layer on a portion of the second surface of the quantum hardware.

18. The computer system of claim 17, wherein the second layer is a thin film configured to seal the second surface from the first layer.

19. The computer system of claim 12, the program instructions to bond the set of wirebonds further comprising:
    program instructions to cure the first layer to mechanically bond the set of wirebonds to the first layer.

20. The computer system of claim 12, wherein the first layer is cured at room temperature.

* * * * *